US006902814B2

(12) United States Patent
Takahashi et al.

(10) Patent No.: US 6,902,814 B2
(45) Date of Patent: Jun. 7, 2005

(54) QUARTZ GLASS PARTS, CERAMIC PARTS AND PROCESS OF PRODUCING THOSE

(75) Inventors: Koyata Takahashi, Sagamihara (JP); Michio Okamoto, Machida (JP); Masanori Abe, Yokohama (JP)

(73) Assignee: Tosoh Corporation, Yamaguchi (JP)

( * ) Notice: Subject to any disclaimer, the term of this patent is extended or adjusted under 35 U.S.C. 154(b) by 0 days.

(21) Appl. No.: 10/289,402

(22) Filed: Nov. 7, 2002

(65) Prior Publication Data

US 2003/0091835 A1 May 15, 2003

(30) Foreign Application Priority Data

Nov. 13, 2001 (JP) .................................... P. 2001-347239
Nov. 13, 2001 (JP) .................................... P. 2001-347240

(51) Int. Cl.[7] .......................... B32B 17/00; B32B 9/00; C23C 4/10
(52) U.S. Cl. ...................... 428/432; 428/337; 428/210; 428/410; 428/699; 428/701; 428/702; 427/453
(58) Field of Search .............................. 428/210, 220, 428/332, 337, 409, 410, 432, 689, 699, 701, 702; 427/453

(56) References Cited

U.S. PATENT DOCUMENTS

| 5,919,332 | A | | 7/1999 | Koshiishi et al. | |
|---|---|---|---|---|---|
| 6,379,789 | B1 | * | 4/2002 | Crowley et al. | 428/336 |
| 6,458,445 | B1 | * | 10/2002 | Inaki | 428/141 |
| 6,479,108 | B2 | * | 11/2002 | Hariharan et al. | 427/453 |
| 6,596,397 | B2 | * | 7/2003 | Kaneyoshi et al. | 428/402 |
| 2001/0003271 | A1 | | 6/2001 | Otsuki | |
| 2003/0026917 | A1 | * | 2/2003 | Lin et al. | 427/453 |

FOREIGN PATENT DOCUMENTS

| JP | 63013333 | 1/1988 |
|---|---|---|
| JP | 8069970 | 3/1996 |
| JP | 8104541 | 4/1996 |
| JP | 8339895 | 12/1996 |

OTHER PUBLICATIONS

Patent Abstracts of Japan—10267562, vol. 1999, No. 01 (1999).
Patent Abstracts of Japan—01249666, vol. 013, No. 592 (1989).
Patent Abstracts of Japan—05214505, vol. 017, No. 663 (1993).
XP–002251843—abstract–(2000).
XP–002251844—abstract (1986).
European Search Report dated Sep. 8, 2003.
Proceedings of the 15th International Thermal Spray Conference, May 25–29, 1998.

* cited by examiner

*Primary Examiner*—Deborah Jones
*Assistant Examiner*—G. Blackwell-Rudasill
(74) *Attorney, Agent, or Firm*—Sughrue Mion, PLLC

(57) ABSTRACT

In quartz glass parts and ceramic parts that are used in film-deposition devices and pre-cleaning devices in the production of semiconductors, etc., there are problems such as peeling off of the parts themselves during the use, peeling off of film-like substances adhered to the part surfaces, contamination of the products and short life time of the parts caused by corrosion of the part surfaces by plasma, and reduction in the productivity by frequent exchange of the parts. In quartz glass parts and ceramic parts that are used in film-deposition devices and pre-cleaning devices in the production of semiconductors, etc., with respect to parts, the surface of which is constituted of a ceramic thermal sprayed coating, ones having the ceramic thermal sprayed coating having a surface roughness Ra of from 5 to 20 $\mu$m are high in adherence of a film-like adherence, ones having the ceramic thermal sprayed coating having a surface roughness Ra of from 1 to 5 $\mu$m are high in plasma resistance, and ones in which grooves having a large anchor effect to the thermal sprayed coating is formed on a substrate on which the ceramic thermal sprayed coating is formed are free from peeling off of the ceramic thermal sprayed coating from the substrate and are high in durability.

18 Claims, 3 Drawing Sheets

QUARTZ GLASS PARTS, CERAMIC PARTS AND PROCESS OF PRODUCING THOSE

FIELD OF THE INVENTION

The present invention relates to quartz glass parts and ceramic parts that are used in film-deposition devices and pre-cleaning devices in the production of semiconductors, etc. The quartz glass parts and ceramic parts according to the present invention prevent dust generation caused by peeling of film-like substances adhered to parts within a device during the film deposition and pre-cleaning operations and markedly improve the durability of parts against plasma generated within the device.

DESCRIPTION OF THE RELATED ART

In the film deposition and pre-cleaning of product substrates of semiconductors, etc., film-like substances are adhered to parts used within a film-deposition device and a pre-cleaning device. It is known that when these parts are continuously used in the film deposition and pre-cleaning, the adhered film-like substances become thick and peel off to cause dust generation within the devices, thereby contaminating the interiors of the devices and the product substrates. Further, in the film-deposition device and pre-cleaning device, plasma is generated within the devices. Thus, there was also a problem that the plasma corrodes the surfaces of the parts and deteriorates the parts, thereby causing dust generation. These phenomena caused a reduction of quality of the product substrates and a reduction of the yield, resulting in a serious problem.

Hitherto, as a method of reducing the dust generation caused by peeling of film-like substances, there is known a method in which the surface of a part is subjected to blast processing to render the surface in a satin-like state, so that adherence of a film-like adherend increases. For example, U.S. Pat. No. 5,460,689 discloses that in order to enhance the adherence of particles that come flying into an inner surface of a quartz bell-jar, blast processing is carried out. Further, U.S. Pat. No. 6,319,842 discloses that in order to enhance the adherence of a film-like adherend accumulated in a ceramic cylinder, the surface of the ceramic cylinder is subjected to blast processing. However, there was a problem that a blast-processed rough surface of the quartz glass includes areas with a low strength or contains broken pieces that begin to peel off, and therefore, the film-like adherend is hard to adhere thereto or is liable to peel off. On the other hand, there is also disclosed a method in which after blast processing of quartz glass, the processed quartz glass is subjected to etching treatment with a hydrofluoric acid solution (see JP-A-8-104541). However, this method involved a problem such that since the surface obtained after etching treatment of the blast-processed surface of the quartz glass with the hydrofluoric acid solution includes areas to which a film-like adherend readily adheres and those to which the film-like adherend hardly adheres, in the case where the film-like adherend is adhered directly on the surface, the adherence is not sufficient.

In order to enhance the adherence of a film-like adherend to a part, there is proposed a method in which a plasma sprayed coating made of a metal or a metallic carbide such as molybdenum, tungsten, aluminum, and tungsten carbide is formed, thereby preventing peeling of the adhered film-like adherend (see JP-A-60-120515 and JP-A-4-268065). However, since the sprayed coating as proposed herein is a sprayed coating made of a metal or a metallic carbide, the adherence of the film-like adherend was not sufficient.

In film-deposition devices and plasma cleaning devices, problems such as corrosion and degradation of the surface of a part by plasma and dust generation caused thereby have hitherto been pointed out. Quartz glass parts used in these devices are eroded by plasma, and generated quartz mists adhere to the product substrates, to reduce the yield. Also, there is pointed out a problem that with the degradation of the quartz glass part, the number of exchange of the part increases so that the operating time of the device decreases (see JP-A-63-13333). In order to solve these problems, it is disclosed to form a dense thermal sprayed coating made of an alumina-based ceramic having higher durability against plasma than quartz on the surface of a quartz glass part by detonation thermal spraying (see JP-A-8-339895). Moreover, JP-A-2001-226773 discloses a method in which a thermal sprayed coating made of a ceramic comprising a compound belonging to the Group 3a, or a compound belonging to the Group 3a with alumina, especially yttria with alumina, having higher corrosion resistance against plasma than alumina, is formed on the surface of a bell-jar made of quartz or alumina. However, according to these methods, while the effect on the plasma resistance could be obtained to some extent, improvements in the adherence of the film-like adherend were not suggested at all.

In the prior art literatures regarding metallic thermal sprayed coatings, it is suggested that a thermal sprayed coating can be utilized for improving the adherence of a film-like adherend. However, no literatures have suggested concrete shapes for enhancing the adherence of the adherend to the thermal sprayed coating, or concrete methods of realizing the surface shape of the thermal sprayed coating. Further, it is known that ceramic thermal sprayed coatings are superior in plasma resistance. However, there is not found any literature to disclose a method of concretely realizing the ceramic thermal sprayed coatings that are satisfactory with the adherence of the film-like adherend.

For example, *Processing of the 15th International Thermal Spray Conference*, May 25–29, 1998 suggests a method of concretely controlling the surface shape of ceramic thermal sprayed coatings. This reports that in plasma spraying with a pure argon atmosphere, when a distance between a spray gun and a substrate is made long, the surface shape of the ceramic thermal sprayed coating can be roughed. However, the surface shape of the thermal sprayed coating obtained in the method of this report is too uneven, so that sufficient effects of the strength of the surface of the thermal sprayed coating itself and the adherence of the film-like adherend could not be expected.

The conventional quartz glass parts and ceramic parts to be used in film-deposition devices and pre-cleaning devices in the production of semiconductors, etc. were not sufficiently satisfied with adherence of a film-like adherend or plasma resistance, so that film deposition or pre-cleaning could not be continuously carried out over a long period of time. The present invention is to provide superior quartz glass parts and ceramic parts to be used in film-deposition devices and pre-cleaning devices in the production of semiconductors, etc., which have high adherence to an accumulated film-like adherend, or high plasma resistance, and can be continuously used over a long period of time.

SUMMARY OF THE INVENTION

Under such circumstances, the present inventors made extensive and intensive investigations. As a result, it has been found that in quartz glass parts having a ceramic thermal sprayed coating formed on a quartz glass surface, a quartz glass part formed with a ceramic thermal sprayed coating having a surface roughness Ra particularly ranging from 5 to 20 μm and a relative density of from 70 to 97% is superior in adherence of a film-like adherend. Further, it has been found that in quartz glass parts having a ceramic thermal sprayed coating formed on a quartz glass, the surface of which is provided with grooves having a width of from 5 to 50 μm by blast processing and etching treatment with an acid containing hydrofluoric acid, the ceramic thermal sprayed coating is especially superior in adhesion to the quartz glass and superior in plasma resistance (Ra is from 1 to 5 μm) or adherence of a film-like adherend (Ra is from 5 to 20 μm). Moreover, it has been found that in ceramic parts having a ceramic thermal sprayed coating on a ceramic substrate, a ceramic part formed with a ceramic thermal sprayed coating having a surface roughness Ra of from 5 to 20 μm is high in adherence of a film-like adherend. The present invention has been accomplished based on these findings.

Specifically, the present invention includes the following aspects.

1) A quartz glass part comprising a quartz glass and a ceramic thermal sprayed coating formed on the surface of the quartz glass, the ceramic thermal sprayed coating having a surface roughness Ra of from 5 to 20 μm and a relative density of from 70 to 97%.

2) A quartz glass part comprising a quartz glass and a ceramic thermal sprayed coating formed on the surface of the quartz glass, the quartz glass having a surface roughness Ra of from 5 to 15 μm and an average length of micro-cracks of from 1 to 100 μm, with an average angle of the micro-cracks to the quartz glass surface being from 10 to 70°, and the ceramic thermal sprayed coating having a surface roughness Ra of from 5 to 20 μm and a relative density of from 70 to 97%.

3) A quartz glass part comprising a quartz glass and a ceramic thermal sprayed coating formed on the surface of the quartz glass, the quartz glass having from 10 to 200 per millimeter of grooves having a width of from 5 to 50 μm, and the ceramic thermal sprayed coating having a surface roughness Ra of from 1 to 20 μm.

4) A quartz glass part comprising a quartz glass and a ceramic thermal sprayed coating formed on the surface of the quartz glass, the quartz glass having from 10 to 200 per millimeter of grooves having a width of from 5 to 50 μm and a length of from 10 to 200 μm, and the ceramic thermal sprayed coating having a surface roughness Ra of from 1 to 20 μm.

5) A ceramic part comprising a ceramic substrate having a ceramic thermal sprayed coating formed thereon, the ceramic thermal sprayed coating having a surface roughness Ra of from 5 to 20 μm.

6) A process of producing the quartz glass part as set forth in 1) to 4) above, which comprises forming a ceramic thermal sprayed coating on a quartz glass by plasma spraying using a raw material powder having a mean particle size of from 30 to 60 μm.

7) A process of producing the quartz glass part as set forth in 2) to 4) above, which comprises subjecting the surface of a quartz glass to blast processing, etching the quartz glass surface with an acid containing at least hydrofluoric acid, and then forming a ceramic thermal sprayed coating on the etched quartz glass surface.

8) A process of producing the ceramic part as set forth in 5) above, which comprises subjecting the surface of a ceramic substrate to blast processing and then forming a ceramic thermal sprayed coating on the blasted ceramic substrate surface by plasma spraying using a raw material powder having a mean particle size of from 30 to 60 μm.

Figure 1:
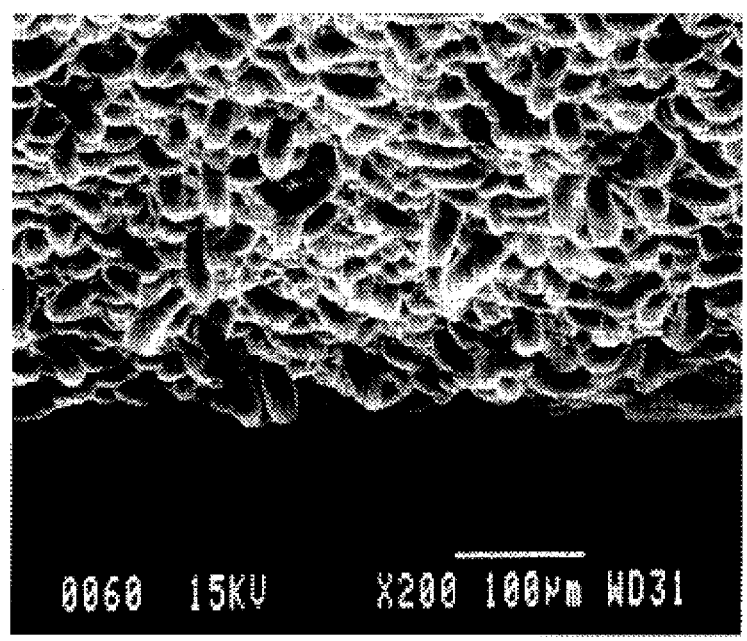
FIG. 1 is an SEM image of a quartz glass surface after blast processing and etching treatment with hydrofluoric acid, as observed obliquely.
Figure 1:
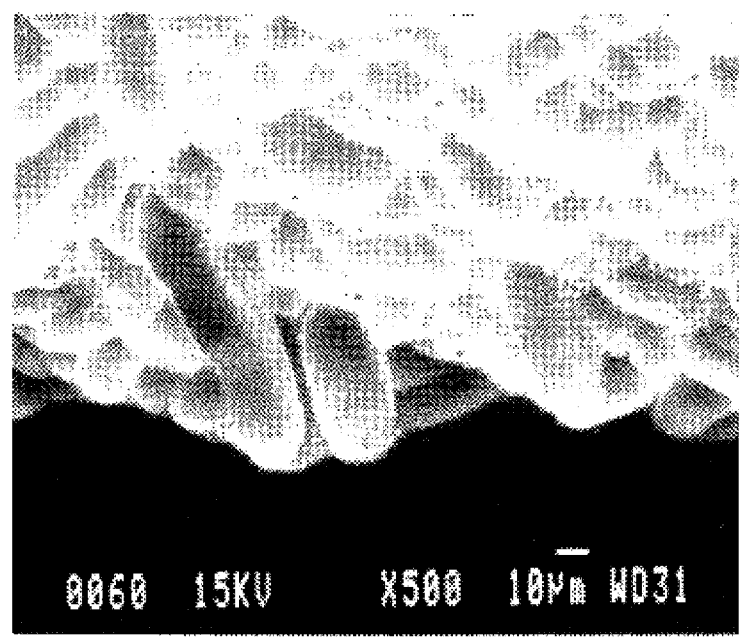

21: quartz glass
22: quartz glass surface having been subjected to blast processing and etching treatment with hydrofluoric acid
23: ceramic thermal sprayed coating
24: groove on quartz glass surface in which ceramic thermal sprayed coating bites in anchor form
31: quartz glass
32: quartz glass surface having been subjected to blast processing
33: ceramic thermal sprayed coating
34: deep micro-cracks that decrease strength of quartz glass
35: peeled-apart fragment
41: quartz bell-jar
42: ceramic thermal sprayed coating
51: quartz bell-jar
52: surface layer of quartz glass on which grooves were formed
53: ceramic thermal sprayed coating

DETAILED DESCRIPTION OF THE INVENTION

The present invention will be described in detail below.

The quartz glass part according to the present invention is a quartz glass part comprising a quartz glass and a ceramic thermal sprayed coating formed on the surface of the quartz glass, the ceramic thermal sprayed coating having a surface roughness Ra of from 5 to 20 μm and a relative density of from 70 to 97%.

The surface of quartz glass as referred to herein means the surface of a quartz glass, to which a film-like adherend adheres, or with which plasma comes into contact, in the case where at least a quartz glass part is used in a film-deposition device or a pre-cleaning device. However, this does not exclude the case where a ceramic thermal sprayed coating is formed on the surface of a quartz glass, to which no film-like adherend adheres, or with which no plasma comes into contact.

The quartz glass part according to the present invention must be formed with a ceramic thermal sprayed coating having a surface roughness Ra of from 5 to 20 μm. When the surface roughness Ra is less than 5 μm, a stress of the film-like adherend adhered to the surface is not sufficiently dispersed, so that the adherence is not satisfactory. On the other hand, when it exceeds 20 μm, particles that come flying cannot sufficiently incorporate into the interior of the coating, so that the adherence is not satisfactory. The surface roughness Ra as referred to herein can be measured by a tracer type surface roughness tester.

The ceramic thermal sprayed coating must have a relative density of from 70 to 97%. As the relative density of the ceramic thermal sprayed coating becomes low, the number of pores present in the surface increases, thereby increasing a surface area, so that the adherence of the film-like adherend is enhanced. Further, when the relative density is low, an internal stress of the ceramic thermal sprayed coating is low, leading to an effect that the ceramic thermal sprayed coating itself hardly peels off from the quartz glass. However, when the relative density is too low, the strength of the ceramic thermal sprayed coating itself and the adherence between the ceramic thermal sprayed coating and the quartz glass are lowered. On the other hand, when the relative density is too high, and the ceramic thermal sprayed coating is too dense, an internal stress of the ceramic thermal sprayed coating is high, so that the ceramic thermal sprayed coating is liable to peel off from the quartz glass. For these reasons, the relative density of the ceramic thermal sprayed coating must be in the range of from 70 to 97%, and preferably in the range of from 85 to 95%. The relative density of the ceramic thermal sprayed coating can be measured by image analysis of an SEM cross-section, or by the Archimedes' method using the formed ceramic thermal sprayed coating peeled off from the glass quartz.

It is preferred that the ceramic thermal sprayed coating is made of alumina, partially stabilized zirconia, or a magnesia-alumina spinel. These ceramics are particularly superior in plasma resistance and adherence of a film-like adherend among ceramics. The crystal form of alumina includes α-, β- and γ-forms. Any of these forms can be used in the parts according to the present invention. As partially stabilized zirconia are preferably used those having, added thereto, yttria or ceria in an amount ranging from 1 to 10% by weight. The magnesia-alumina spinel preferably used is a spinel having a molar ratio of magnesia to alumina of 1/1.

In the case where partially stabilized zirconia is used as the material of the ceramic thermal sprayed coating, after adhesion of a film-like adherend, the removal of the film-like adherend can be carried out by other methods than the etching with an acid. For example, it is possible to remove of the thermal sprayed coating made of partially stabilized zirconia together with the film-like adherend by keeping it in an environment at 100 to 300° C. and at a humidity of 50% or higher.

Preferably, the ceramic thermal sprayed coating has a high purity of 99% by weight or more, and particularly 99.9% by weight or more. In the case where quartz glass parts are used for film formation and pre-cleaning of semiconductors, etc., Na is an element that is especially undesired. The surface of the ceramic thermal sprayed coating of the quartz glass part according to the present invention is exposed directly to plasma, and impurities may possibly come out from the thermal sprayed coating. Accordingly, it is particularly preferred that the Na content is 0.05% or less. The purity of the thermal sprayed coating can be evaluated by chemical analysis after peeling off the thermal sprayed coating and dissolving it, or by X-ray fluorescent analysis of the surface of the thermal sprayed coating.

Preferably, the ceramic thermal sprayed coating has a film thickness of from 0.05 to 0.5 mm. When the film thickness is less than 0.05 mm, the coating is non-uniform, so that its effects cannot be sufficiently exhibited, whereas when it exceeds 0.5 mm, the ceramic thermal sprayed coating is liable to peel off from the quartz glass because of the internal stress of the thermal sprayed coating. The film thickness of the ceramic thermal sprayed coating can be measured by forming a thermal sprayed coating on a quartz glass part having a known thickness and then measuring the entire thickness, or by microscopically observing a cross-section after thermal spraying.

In the quartz glass parts according to the present invention, it is preferred that the ceramic thermal sprayed coating is formed on the surface of a quartz glass having a surface roughness Ra of from 5 to 15 μm and an average length of micro-cracks of from 1 to 100 μm, with an average angle of the micro-cracks to the quartz glass surface being from 10 to 70°. The ceramic thermal sprayed coating formed on the quartz glass having such a surface shape can especially keep the strength of the quartz glass high while keeping high adherence.

The strength of the quartz glass is liable to decrease, as the number of micro-cracks having a vertical depth exceeding 100 μm present in the surface of the quartz glass substrate increases. It is better that the number of micro-cracks is low. Preferably, the number of micro-cracks having a length of 20 μm or more does not exceed 50 per square cm.

The average angle of the micro-cracks to the quartz glass surface is from 10 to 70°, and preferably from 40 to 70°. When the average angle is less than 10°, the quartz glass is liable to peel off as a fragment from the surface of the quartz glass, whereas when it exceeds 70°, the strength of the quartz glass main body is lowered.

The surface roughness of the quartz glass substrate can be evaluated by a tracer type surface roughness tester, and the state of the micro-cracks can be confirmed by observation by an optical microscope. The average angle of the micro-cracks may be obtained in terms of an average value of about 50 micro-cracks.

Next, the quartz glass part according to the present invention is a quartz glass part comprising a ceramic thermal sprayed coating formed on the surface of a quartz glass having from 10 to 200 per millimeter of grooves having a width of from 5 to 50 μm.

In the quartz glass part, when grooves having a width of from 5 to 50 μm are provided in the quartz glass, the adherence between the quartz glass and the ceramic thermal sprayed coating is markedly improved. When the width of the grooves is less than 5 μm, the ceramic thermal sprayed coating cannot sufficiently incorporate into the grooves, so that an anchor effect to the ceramic thermal sprayed coating is not sufficient. On the other hand, when it exceeds 50 μm, the intrusion into the ceramic thermal sprayed coating is not sufficient.

It would be preferred that the length of the grooves is short because the quartz glass is prevented from cracking by the contact area with the ceramic thermal sprayed coating or the internal stress of the ceramic thermal sprayed coating. However, in order to obtain a proper surface roughness, a certain amount of the length is needed. For this reason, in the present invention, the groove length is preferably from 10 to 200 μm.

A number of the grooves is in the range of from 10 to 200 per millimeter. When the number of the grooves is less than 10 per millimeter, the anchor effect is not sufficient, whereas when it exceeds 200 per millimeter, the grooves overlap each other, so that the effect is reduced. The grooves can be formed by combining blast processing with etching with an acid containing hydrofluoric acid, as described later. FIG. 1 shows an SEM image of a quartz glass surface having a number of grooves formed thereon, as observed obliquely. The grooves are in a slender ellipse shape and are respectively concave.

The surface roughness Ra of the ceramic thermal sprayed coating to be formed on the quartz glass having grooves of the present invention is in the range of from 1 to 20 $\mu$m. Since the quartz glass has the characteristic grooves, even when the surface roughness Ra is in the range of from 1 to 5 $\mu$m, the ceramic thermal sprayed coating does not peel off from the quartz glass. When the surface roughness Ra is in the range of from 5 to 20 $\mu$m, the adherence of the film-like adherend is superior. On the other hand, when the surface roughness Ra is in the range of from 1 to 5 $\mu$m, while the adherence of the film-like adherend is inferior to that in the case where it is in the range of from 5 to 20 $\mu$m, the plasma resistance is superior as compared with that of the conventional parts.

In this case, it is also preferred that the ceramic thermal sprayed coating is made of alumina, partially stabilized zirconia, or a magnesia-alumina spinel.

Preferably, the ceramic thermal sprayed coating has a purity of 99% by weight ore more, and particularly 99.9% by weight or more and has an Na content of 0.05% or less. Further, the ceramic thermal sprayed coating preferably has a film thickness of from 0.05 to 0.5 mm.

In addition, the present invention proposes ceramic parts along with the quartz glass parts. The ceramic part according to the present invention is a ceramic part comprising a ceramic substrate and a ceramic thermal sprayed coating formed on the surface of the ceramic substrate, the ceramic thermal sprayed coating having a surface roughness Ra of from 5 to 20 $\mu$m. In the case of the ceramic part, when the surface roughness Ra of the ceramic thermal sprayed coating ranges from 5 to 20 $\mu$m, high adherence of a film-like adherend is achieved similarly.

The surface of the ceramic substrate as referred to herein means the surface of a ceramic substrate, to which a film-like adherend adheres, or with which plasma comes into contact, in the case where at least a ceramic part is used in a film-deposition device or a pre-cleaning device. However, this does not exclude the case where a ceramic thermal sprayed coating is formed on the surface of a ceramic substrate, to which no film-like adherend adheres, or with which no plasma comes into contact.

Preferably, the ceramic thermal sprayed coating has a purity of 99% by weight ore more, and particularly 99.9% by weight or more and has an Na content of 0.05% or less. Further, the ceramic thermal sprayed coating preferably has a film thickness of from 0.05 to 0.5 mm.

The ceramic substrates that can be used are sintered materials of alumina, zirconia, mullite, yttrium-aluminum garnet, silicon nitride, and aluminum nitride.

Similar to the case of the quartz glass part, in the case of the ceramic part, it is particularly preferred that the ceramic thermal sprayed coating is made of alumina, partially stabilized alumina, or a magnesia-alumina spinel. In the case of alumina, $\alpha$-alumina is particularly preferred. In the case of $\alpha$-alumina, it particularly has high acid resistance, so that during removal of the film-like adherend by etching with an acid, the ceramic thermal sprayed coating itself is hardly dissolved and hence, it can be used repeatedly.

Next, the production of the quartz glass parts and the ceramic parts according to the present invention will be described.

With respect to the quartz glass parts according to the present invention, a ceramic thermal sprayed coating is formed on a quartz glass by using a raw material powder having a mean particle size of from 30 to 60 $\mu$m by plasma spraying.

By plasma spraying of a raw material having a mean particle size in the range of from 30 to 60 $\mu$m, the ceramic thermal sprayed coating falling within the scope of the present invention can be formed. When the mean particle size of the raw material is less than 30 $\mu$m, the surface roughness Ra of the obtained ceramic thermal sprayed coating becomes small. On the other hand, when it exceeds 60 $\mu$m, the surface roughness Ra becomes too large, so that the adherence of the film-like adherend and the adherence of the ceramic thermal sprayed coating itself to the quartz glass are low. The mean particle size of the raw material powder can be measured by, for example, a centrifugal sedimentation type particle size distribution measurement device.

Prior to thermal spraying of the ceramic, the surface of the quartz glass may be made rough by blast processing. Further, after the blast processing of the quartz glass, fragments of the broken quartz remain on the surface of the quartz glass. Accordingly, it is preferred to rinse the surface of the quartz glass with pure water, an acid, or the like before the thermal spraying of the ceramic.

When the surface of the quartz glass is subjected to grit blasting, micro-cracks are generated in the vicinity of the surface, so that the strength of the quartz glass is lowered. Thus, when the substrate surface is subjected to blast processing using spherical grit made of partially stabilized zirconia or the like and having so sufficient toughness that it does not shatter upon collision with the quartz glass substrate, it is possible to obtain a state in which the surface roughness Ra of the quartz glass substrate as a ground of the ceramic thermal sprayed coating is from 5 to 15 $\mu$m, and the micro-cracks of the substrate surface have an average length of 100 $\mu$m or less and an average angle to the substrate surface of 70° or less. As to the grit to be used, when one that is originally spherical but breaks into a non-spherical form during the use is used, the effects found in the present invention are hardly obtained. For example, though silica grit is spherical before the use, it becomes non-spherical during the blasting because its toughness is low. Accordingly, the silica grit is not preferred for the use in the present invention.

Preferably, the plasma thermal spraying of the present invention is carried out at a distance between a plasma gun and the quartz glass substrate in the range of from 140 to 180 mm by using a plasma gas having hydrogen added thereto. When the distance between the plasma gun and the quartz glass substrate is shorter than 140 mm, the obtained thermal sprayed coating becomes minute and has a relative density exceeding 97%, so that the thermal sprayed coating is liable to peel off from the quartz glass by the internal stress of the thermal sprayed coating. Further, the surface roughness Ra of the thermal sprayed coating becomes low, so that the adherence of the film-like adherend is lowered. On the other hand, when it is longer than 180 mm, the adhesion of the thermal sprayed coating to the quartz glass is low, and the surface roughness Ra of the thermal sprayed coating exceeds 20 $\mu$m, the adherence of the film-like adherend is lowered. When the distance is further long, the thermal sprayed particles do not attach to the quartz glass.

The plasma spraying is usually carried out in an argon gas. By adding hydrogen to argon, it becomes possible to increase the temperature of a plasma flame. Especially, it is possible to inhibit a reduction of the plasma temperature in an end terminal. An amount of hydrogen to be added is preferably in the range of from 10 to 50%, and particularly in the range of from 20 to 40%. When the distance between the spray gun and the substrate is long, droplet particles of a spraying liquid in the plasma are cooled at the time when they have reached the substrate, the surface of the thermal sprayed coating becomes rough, and the density is lowered. This matter is described in the above-cited reference, *Processing of the 15th International Thermal Spray Conference, 25–29May 1998*. For this reason, by only making the distance between the spray gun and the substrate long, the surface of the thermal sprayed coating becomes too rough, so that the surface shape of the ceramic thermal sprayed coating falling within the scope of the present invention cannot be obtained. In the process according to the present invention, during making the distance between the spray gun and the substrate long, by adding hydrogen in the plasma gas, a suitable melting state is achieved in a tip of the plasma flame of droplet particles of the spraying liquid. Thus, it has been found that the surface shape of the ceramic thermal sprayed coating falling within the scope of the present invention can be realized.

In order to form the ceramic thermal sprayed coating of the quartz glass part of the present invention, it is especially preferred to use a high-purity raw material. Particularly, it is preferred to use a high-purity product having a purity of 99% by weight or more, and particularly 99.9% by weight or more. The thermal spraying powder can be prepared by electromelting pulverization or granulation. In achieving the surface shape of the present invention, it is particularly preferred to use a spherical powder prepared by sintering granulated grains to render them dense so as to have a relative density of 80% or more.

In order to increase the purity of the quartz glass part of the present invention, particularly to decrease the Na content of the surface, after forming the ceramic thermal sprayed coating, it may be rinsed with an acid. Examples of the liquid of the acid used for rinsing are aqueous solutions of nitric acid and hydrofluoric acid. It is possible to reduce the Na content of the surface by dipping the quartz glass part for from several tens minutes to several hours.

Next, the quartz glass part comprising a ceramic thermal sprayed coating formed on the surface of a quartz glass having from 10 to 200 per millimeter of grooves having a width of from 5 to 50 µm according to the present invention can be produced by subjecting the surface of a quartz glass to blast processing, etching it with an acid containing at least hydrofluoric acid to form grooves, and then forming a ceramic thermal sprayed coating thereon.

In the production of the quartz glass part, prior to the thermal spraying of the ceramic, the surface is subjected to blast processing using grit made of, for example, alumina, to render it rough so as to have a surface roughness Ra of from 2 to 20 µm, and preferably from 5 to 15 µm. When the blast processing is carried out, a layer containing micro-cracks and having a low strength is formed on the quartz glass surface. However, in the case of the present invention, there is no problem because after the blast processing, the quartz glass surface is etched with an acid containing hydrofluoric acid.

In the blast processing of the quartz glass, it is particularly preferred to use spherical grit like the case as previously shown. When the quartz glass is subjected to blast processing using grit, micro-cracks are usually generated in the vicinity of the surface, leading to a reduction of the strength of the quartz glass. However, in the present invention, it has been found that when the quartz glass surface is subjected to blast processing using spherical grit, it is possible to form micro-cracks of 100 µm or less on the quartz glass surface without forming cracks exceeding 100 µm intruded into the quartz glass.

Also, especially in the case where spherical grit is used, it is possible to form a rough surface having grooves having a relatively short length of from 10 to 200 µm and having a surface roughness Ra of from 5 to 15 µm. In the case where spherical grit is used, ones formed with grooves having a length shorter than the diameter of the grit are readily obtained. For this reason, it is preferred to use spherical grit having a diameter of 200 µm or less.

As to the material quality of the grit, it is possible to use alumina, silicon carbide, and zirconia. In the case where spherical grit is used, it is preferred to use grit having so sufficient toughness that it does not shatter upon collision with the quartz glass substrate. Regarding the material quality to meet these requirements, partially stabilized zirconia is particularly preferred.

Next, the blast-processed quartz glass is subjected to etching treatment with an acid containing at least hydrofluoric acid. According to the etching treatment, not only areas whose strength has been lowered are dissolved and removed, but also grooves having a width of from 5 to 50 µm, by which the present invention is characterized, are formed. These grooves are formed such that their widths are widened while the micro-cracks of 100 µm or less, as previously formed by the blast processing, function as nuclei.

It is preferred that a concentration of hydrofluoric acid as the acid to be used for the etching is in the range of from 5 to 50% by weight. An etching treatment time varies depending on the concentration of hydrofluoric acid and the temperature, but is usually in the range of from 0.5 to 24 hours. To hydrofluoric acid may be added an acid such as nitric acid. The grooves to be formed can be confirmed by microscopic-observation. When the groove width has reached from about 10 to 20 µm, the etching rate becomes slow, so that it is easy to control the size of the grooves. It is possible to adjust the number of the grooves at from about 10 to 200 per millimeter by regulating the acid concentration and the time.

Figure 2:
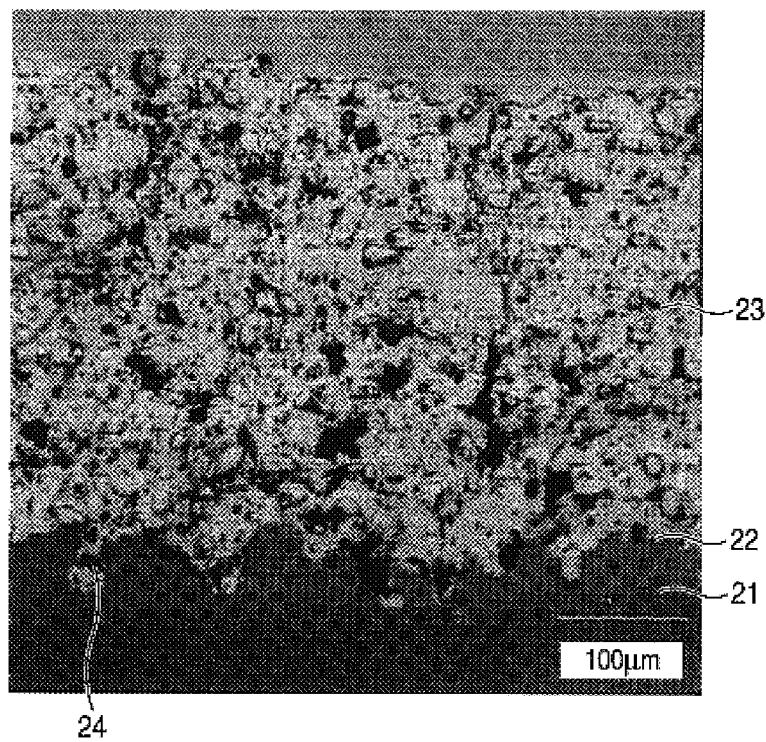
FIG. 2 is an SEM image of a cross-section of a quartz glass surface having been subjected to blast processing and etching treatment with hydrofluoric acid, on which is formed a ceramic thermal sprayed coating.
Figure 3:
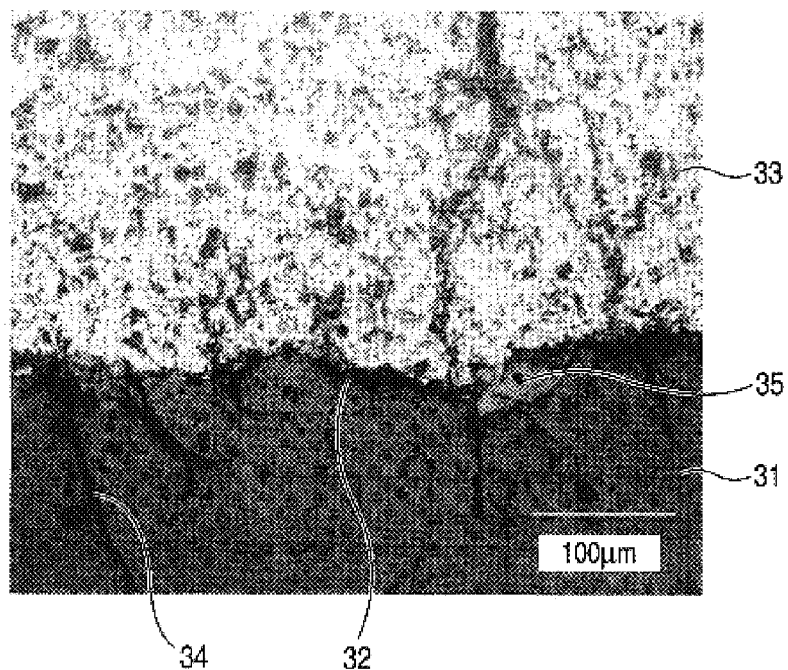
FIG. 3 is an SEM image of a cross-section of a quartz glass surface having been subjected to blast processing only but not to etching treatment with hydrofluoric acid, on which is formed a ceramic thermal sprayed coating.

Here, FIG. 2 shows a cross-section of a quartz glass part prepared by subjecting the surface of a quartz glass to blast processing under a pressure of 0.5 MPa using grit WA #220 and etching treatment with 24% by weight hydrofluoric acid for one hour and then forming an alumina thermal sprayed coating thereon. In the quartz glass part shown in FIG. 2, the ceramic thermal sprayed coating is firmly anchored in grooves having a width of from 10 to 30 µm. For comparison, FIG. 3 shows a cross-section of a quartz glass part prepared by subjecting a quartz glass to blast processing (grit WA #60, pressure: 0.5 MPa) and then directly forming an alumina thermal sprayed coating thereon without subjecting to etching treatment with hydrofluoric acid. In the quartz glass part shown in FIG. 3, not only a number of micro-cracks that likely lower the strength of the quartz glass are observed, but also broken and peeled-apart fragments remain. In addition, it can be understood that the ceramic thermal sprayed coating does not incorporate into the micro-cracks, and therefore, the anchor effect of the thermal sprayed coating is not sufficient, and the adherence is low.

Particularly preferable method of forming ceramic thermal sprayed coatings is plasma spraying. However, in the case of the quartz glass part using a groove-formed quartz glass according to the present invention, it is also possible to form ceramic thermal sprayed coatings by high-velocity thermal spraying, detonation thermal spraying, or rokide spraying. In the case where the plasma spraying is employed for the formation of thermal sprayed coatings, the conditions are the same as those shown previously.

A preferred embodiment with respect to the purity of a raw material to be used for the thermal sprayed coating, the film thickness, the kind of a ceramic to be thermal sprayed, and the rinsing with an acid after the thermal spraying is the same as in the case of the quartz glass part as shown previously.

Next, the ceramic part comprising a ceramic substrate and a ceramic thermal sprayed coating formed on the surface of the ceramic substrate, the ceramic thermal sprayed coating having a surface roughness Ra of from 5 to 20 $\mu$m, can be produced by forming a ceramic sprayed coating by plasma thermal spraying using a raw material powder having a mean particle size of from 30 to 60 $\mu$m.

In the case where a ceramic is used as the substrate, preferred ranges with respect to the blast processing prior to the ceramic thermal spraying, the rinsing with an acid, the purity of the raw material powder, the shape of the raw material powder, the film thickness of the thermal sprayed coating, the distance between a spray gun and the substrate in the thermal spraying, and the composition of plasma gas are the same as in the case of the quartz glass part as shown previously.

Here, in the case of the ceramic part, it is preferred to heat the formed ceramic thermal sprayed coating at from 1,000 to 1,600° C. By heating at 1,000° C. or higher, crystal defects of the ceramic thermal sprayed coating are reduced, and the acid resistance of the ceramic thermal sprayed coating is improved. When the acid resistance of the ceramic thermal sprayed coating is improved, after using the ceramic part for the film deposition and pre-cleaning, during the removal of the film-like adherend on the part by etching with an acid, the ceramic thermal sprayed coating itself is free from dissolution, and hence, the part can be repeatedly used. Why the heat treatment gives rise to effects are considered for the following reasons. That is, in the case where the ceramic thermal sprayed coating is made of alumina, the content of $\gamma$-alumina in the thermal sprayed coating is reduced by the heat treatment at 1,000° C. or higher. Further, in the case other than alumina, the reduction of lattice defects of the crystals may be considered the main reason. On the other hand, when the heat treatment temperature exceeds 1,600° C., there are problems such as breakage of the part, and hence, such is not preferred. The heat treatment time is in the range of from approximately several minutes to 10 hours, and preferably from about 30 minutes to 3 hours. It is preferred to carry out the heat treatment in an atmosphere or a pure-oxygen atmosphere.

The quartz glass part and the ceramic part, each of which is formed with a ceramic thermal sprayed coating, can be used for a bell-jar or a shield of film-deposition devices or pre-cleaning devices, or as a part of a section of insulating parts to which an accumulated film is adhered. The film deposition as referred to herein means a method of forming a film on a substrate by CVD (chemical vapor deposition method) or by utilizing vapor-phase plasma such as sputtering method, and the pre-cleaning means cleaning by etching the surface of a substrate by plasma.

The present invention will be described in more detail with reference to the following Examples, but it should not be construed that the present invention is limited thereto.

EXAMPLE 1

Figure 4:
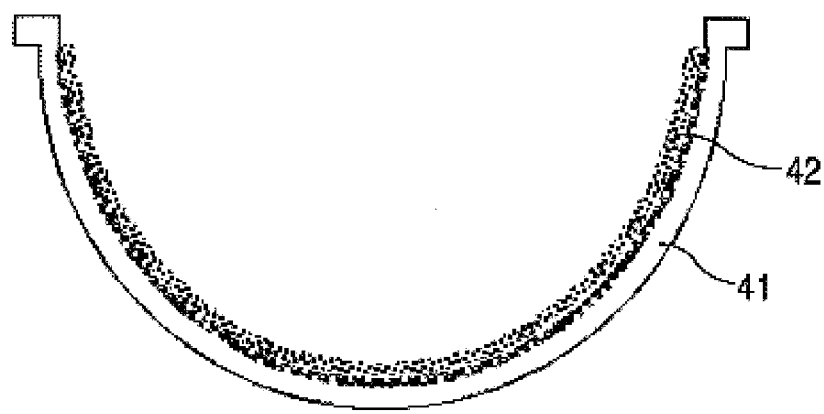
FIG. 4 is a schematic view of a cross-section of a quartz bell-jar having been subjected to blast processing, on which is further formed a ceramic thermal sprayed coating.

A quartz bell-jar to be used for pre-cleaning, as schematically shown in FIG. 4, was prepared. An inner surface of a quartz bell-jar 41 was subjected to blast processing at a pressure of 0.5 MPa using white alumina-made grit WA #60, ultrasonically rinsed with pure water, and dried in an oven. Thereafter, an alumina thermal sprayed coating 42 was formed on the inner surface of the quartz bell-jar by plasma spraying in a flow rate of Ar to $H_2$ of 80/20. For the plasma spraying were used two kinds of thermal spraying materials having a purity of 99.8% and having a mean particle size of 30 $\mu$m and 50 $\mu$m, respectively, each of which was prepared by electromelting pulverization. A film thickness of the thermal sprayed coating varied depending on the place but was from 0.2 to 0.3 mm. A surface roughness Ra of the thermal sprayed coating was 9 $\mu$m for the spraying material having a mean particle size of 30 $\mu$m and 12 $\mu$m for the spraying material having a mean particle size of 50 $\mu$m, respectively. After the plasma spraying, the bell-jar was dipped in a 5% by weight nitric acid aqueous solution kept at a temperature of 40° C. for one hour, ultrasonically rinsed with ultrapure water, and dried in a clean oven.

The alumina thermal sprayed coating peeled off using hydrofluoric acid was measured with respect to the relative density by the Archimedes' method. In this Example 1, in the case of the spraying material having a mean particle size of 30 $\mu$m, the relative density was 83%, and in the case of the spraying material having a mean particle size of 50 $\mu$m, the relative density was 80%.

EXAMPLE 2

An inner surface of a quartz bell-jar 41 was subjected to blast processing at a pressure of 0.5 MPa using white alumina-made grit WA #60, ultrasonically rinsed with pure water, and dried in an oven. Thereafter, an alumina thermal sprayed coating 42 was formed on the inner surface of the quartz bell-jar by plasma thermal spraying in a flow rate of Ar to $H_2$ of 75/25 at a distance between a plasma gun and a substrate of 150 mm. For the plasma spraying was used a spherical alumina granulated powder (purity: 99.99% by weight) having a mean particle size of 50 $\mu$m, as prepared by sintering so as to have a relative density of about 95%. A film thickness of the thermal sprayed coating varied depending on the place but was from 0.2 to 0.3 mm. A surface roughness Ra of the thermal sprayed coating was 13 $\mu$m. After the plasma spraying, the bell-jar was ultrasonically rinsed with ultrapure water and dried in a clean oven. There was thus completed a quartz bell-jar corresponding to the first aspect of the present invention. The alumina thermal sprayed coating peeled off using hydrofluoric acid was measured with respect to the relative density by the Archimedes' method. As a result, the relative density was 81%. An Na content of the alumina thermal sprayed coating was measured by X-ray fluorescent analysis. As a result, Na content was less than a detection limit 0.01% by weight.

EXAMPLE 3

Quartz glass parts formed with a thermal sprayed coating, corresponding to the first aspect of the present invention, were prepared in the same manner as in Example 2, while using, as a raw material powder, a YSZ power having a mean particle size of 40 $\mu$m (partially stabilized zirconia containing 5% by weight of yttria) and spherical granulated particles having a mean particle size of 45 μm, as prepared by mixing alumina (purity: 99.9% by weight) and magnesia (purity: 99.9% by weight) in a ratio of 1/1. There were thus obtained quartz glass parts having a film thickness of the thermal sprayed coating of from 0.2 to 0.3 mm and a surface roughness Ra of the thermal sprayed coating of 15 μm and 17 μm, respectively, corresponding to the first aspect of the present invention. The thermal sprayed coating had a relative density measured by the Archimedes' method of 88% and 92%, respectively.

COMPARATIVE EXAMPLE 1

An inner surface of a quartz-made bell-jar was subjected to blast processing at a pressure of 0.5 MPa using white alumina-made grit WA #60, ultrasonically rinsed with ultra-pure water, and dried in a clean oven. There was thus obtained a quartz bell-jar without forming an alumina thermal sprayed coating. The quartz bell-jar had a surface roughness Ra of 5 μm.

COMPARATIVE EXAMPLE 2

A quartz bell-jar having an alumina thermal sprayed coating formed thereon was prepared in the same manner as in Example 1, except that the mean particle size of the thermal spraying material was 20 μm, the flow rate of Ar to $H_2$ was 70/30, and the distance between the plasma gun and the quartz glass was 80 mm. The quartz bell-jar bad a surface roughness Ra of 3 μm, i.e., the surface roughness was small.

EXAMPLE 4

Any of the quartz bell-jars of Examples 1, 2 and 3 were free from peeling off of the thermal sprayed coating and were well finished. The quartz bell-jars of Examples 1, 2 and 3 and Comparative Examples 1 and 2 were each used in a pre-cleaning device. In the case of Comparative Example 1 (where no alumina thermal sprayed coating was formed) and Comparative Example 2 (where the surface roughness Ra of the alumina thermal sprayed coating was small), 100 hours after the use, particles caused by peeling off of the film-like adherend were collected in the device. On the other hand, in the case of Examples 1, 2 and 3, even 200 hours after the use, peeled-off particles were not observed, and it was confirmed that the bell-jars of Examples 1, 2 and 3 could be used continuously for a two-fold period of time under the same conditions for use. In the case of Comparative Example 1, not only peeling off of the film-like adherend was observed, but also peeling off and blister of the alumina thermal sprayed coating itself were observed.

Similarly, the quartz bell-jars of Examples 1, 2 and 3 and Comparative Examples 1 and 2 were each used in a film-deposition device by CVD. In the case of Comparative Example 1 (where no alumina thermal sprayed coating was formed) and Comparative Example 2 (where the surface roughness Ra of the alumina thermal sprayed coating was small), 70 hours after the use, particles caused by peeling off of the film-like adherend were collected in the device. On the other hand, in the case of Examples 1, 2 and 3, even 150 hours after the use, peeled-off particles were not observed, and it was confirmed that the bell-jars of Examples 1, 2 and 3 could be used continuously for more than a two-fold period of time under the same conditions for use.

EXAMPLE 5

Two quartz plates having a width of 10 mm, a length of 40 mm and a thickness of 6 mm were subjected to blast processing at a pressure of 0.5 MPa using white alumina-made grit WA #48 and partially stabilized zirconia beads having a particle size distribution of from 20 to 125 μm respectively, ultrasonically rinsed with pure water, and then dried in an oven. Surface roughnesses Ra of the blasted surface of the quartz plates were 7 μm and 8 μm, respectively. Thereafter, an alumina thermal sprayed coating was formed by plasma thermal spraying in a flow rate of Ar to $H_2$ of 75/25. For the plasma thermal spraying was used a spraying material having a purity of 99.8% and having a mean particle size of 40 μm, which was prepared by electromelting pulverization. A film thickness of each of the thermal sprayed coatings was from 0.2 mm. A surface roughness Ra of each of the thermal sprayed coatings was 11 μm.

Eleven pieces of each of the quartz glass plates prepared by using alumina grit and spherical partially stabilized zirconia grit, respectively were prepared. A cross-section of each piece was examined for micro-cracks having a length of 20 μm or more by an optical microscope while moving a focal point by 10 mm. As a result, in the case where the alumina grit was used, the micro-cracks had an average length of 130 μm and an average angle to the substrate surface of approximately 90°. On the other hand, in the case where the spherical partially stabilized zirconia grit was used, the micro-cracks had an average length of 80 μm and an average angle to the substrate surface of about 60°. Further, a bending strength of the respective eleven pieces was measured. As a result, in the case of the alumina grit, the bending strength was 40 MPa, and in the case of the spherical partially stabilized zirconia grit, the bending strength was 60 MPa. Also, the quartz glass sheet before the blast processing had a bending strength of 100 MPa. Thus, it was understood that by using the spherical stabilized zirconia beads as the blasting material, the reduction of the bending strength was especially inhibited.

EXAMPLE 6

Figure 5:
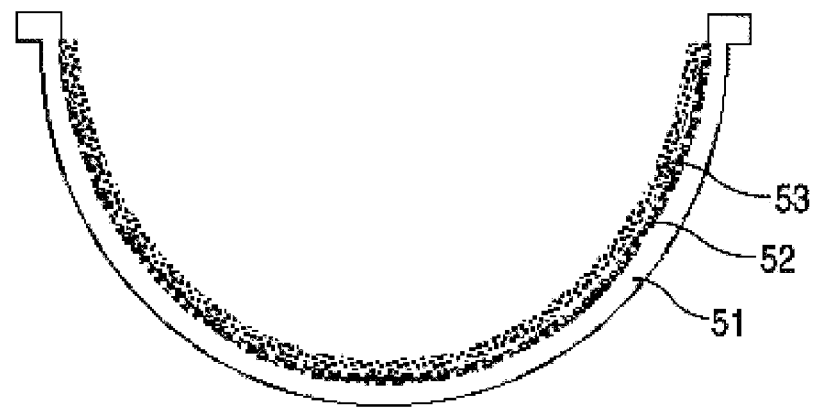
FIG. 5 is a schematic view of a cross-section of a quartz bell-jar having been subjected to blast processing and etching treatment with hydrofluoric acid, on which is further formed a ceramic thermal sprayed coating.

A quartz bell-jar having a structure as schematically shown in FIG. 5 was prepared. An inner surface of a quartz bell-jar 51 was subjected to blast processing at a pressure of 0.5 MPa using white alumina (WA) grit, and 24% by weight of hydrofluoric acid was then poured into the bell-jar 51. The bell-jar 51 was kept for one hour to undergo etching treatment. There was thus formed a layer of grooves 52. Here, three kinds of grit, WA #220, WA #120 and WA #60 were used to prepare three quartz bell-jars. The inner surface of each bell-jar after the etching process had a surface roughness Ra of 4 μm for WA #220, 8 μm for WA #120 and 14 μm for WA #60, respectively. Further, the groove width was from 10 to 30 μm. Moreover, the groove length was from 10 to 120 μm for WA #220, from 10 to 200 μm for WA #120 and from 20 to 300 μm for WA #60, respectively. On the inner surface of each quartz bell-jar having the grooves 52 was formed an alumina thermal sprayed coating 53 by plasma thermal spraying. For the plasma spraying was used a spraying material having a mean particle size of 50 μm and a purity of 99.8%. A film thickness of the thermal sprayed coating varied depending on the place but was from 0.2 to 0.4 mm. A surface roughness Ra of the thermal sprayed coating was 9 μm for grit WA #220, 10 μm for grit WA #120 and 14 μm for grit WA #60, respectively. After the thermal spraying, the bell-jar was rinsed in a clean room. There were thus completed quartz bell-jars having a ceramic thermal sprayed coating made of alumina.

EXAMPLE 7

An inner surface of a quartz bell-jar 51 was subjected to blast processing at a pressure of 0.5 MPa using YSZ (sintered granules of partially stabilized zirconia having 5% by weight of yttria added thereto, particle shape: spherical, particle size: from 40 to 120 μm), and 24% by weight of hydrofluoric acid was then poured into the bell-jar 51. The bell-jar 51 was kept for one hour to undergo etching treatment. There was thus formed a layer of grooves 52 having a surface roughness Ra of 7 μm, a groove width of from 10 to 30 μm and a groove length of from 10 to 120 μm. Next, the inner surface of the quartz bell-jar was subjected to plasma spraying using YSZ spraying granules (sintered granules of partially stabilized zirconia having 5% by weight of yttria added thereto, particle shape: spherical, mean particle size: 40 μm) and granules having a mean particle size of 45 μm, as prepared by mixing 99.9% alumina and 99.9% magnesia in a ratio of 1/1 and at a distance between a plasma gun and the quartz glass of 150 mm. There were thus formed a partially stabilized zirconia thermal sprayed coating 53 and a magnesia-alumina spinel thermal sprayed coating 53. A film thickness of the thermal sprayed coating was from 0.15 to 0.25 mm. A surface roughness Ra of the thermal sprayed coating was 12 μm and 15 μm, respectively. After the plasma spraying, the bell-jar was rinsed in a clean room. There were thus completed a quartz bell-jar having a ceramic thermal sprayed coating made of partially stabilized zirconia and a quartz bell-jar having a ceramic thermal sprayed coating made of a magnesia-alumina spinel.

EXAMPLE 8

Any of the quartz bell-jars of Examples 6 and 7 were quite free from peeling off of the thermal sprayed coating and were well finished. The quartz bell-jars of Examples 6 and 7 and Comparative Examples 1 and 2 were each used in a pre-cleaning device. In the quartz bell-jars of Comparative Examples 1 and 2, 50 hours after the use, particles caused by peeling off of the film-like adherend were collected in the device. On the other hand, in the case of Examples 6 and 7, even 100 hours after the use, peeled-off particles were not observed, and it was confirmed that the bell-jars of Examples 6 and 7 could be used continuously for a two-fold period of time under the same conditions for use.

Similarly, the quartz bell-jars of Examples 6 and 7 and Comparative Examples 1 and 2 were each used for film deposition by sputtering. In the case of Comparative Example 1 (where no alumina thermal sprayed coating was formed) and Comparative Example 2 (where the surface roughness Ra of the alumina thermal sprayed coating was small), 70 hours after the use, particles caused by peeling off of the film-like adherend were collected in the device. On the other hand, in the case of Examples 6 and 7, even 150 hours after the use, peeled-off particles were not observed, and it was confirmed that the bell-jars of Examples 6 and 7 could be used continuously for more than a two-fold period of time under the same conditions for use.

EXAMPLE 9

A ceramic cylinder to be used for pre-cleaning was prepared. A ceramic cylinder (made of 99.9% alumina) was subjected to blast processing at a pressure of 0.5 MPa using silicon carbide C#24 so as to have a surface roughness Ra of 9 μm. Next, the inner surface of the ceramic cylinder was subjected to plasma spraying using YSZ spraying granules (sintered granules of partially stabilized zirconia having 5% by weight of yttria added thereto, particle shape: spherical, mean particle size: 40 μm), to form a thermal sprayed coating made of partially stabilized zirconia. A part of the ceramic cylinder was cut out and evaluated. As a result, the thermal sprayed coating had a film thickness of from 0.1 to 0.2 mm and a surface roughness Ra of 11 μm. After the thermal spraying, the ceramic cylinder was rinsed in a clean room. There was thus completed a ceramic cylinder having a ceramic thermal sprayed coating made of partially stabilized zirconia.

EXAMPLE 10

A ceramic cylinder was subjected to plasma spraying in the same manner as in Example 9 to form a thermal sprayed coating made of partially stabilized zirconia, except for subjecting to blast processing at a pressure of 0.5 MPa using silicon carbide C#24 and dipping in nitric-hydrofluoric acid (a mixed aqueous solution of 30% nitric acid and 24% hydrofluoric acid). A part of the ceramic cylinder was cut out and evaluated. As a result, the thermal sprayed coating had a surface roughness Ra of 9 μm.

Comparative Example 3

A ceramic cylinder was subjected to blast processing at a pressure of 0.5 MPa using alumina grit WA #24 so as to have a surface roughness Ra of 3 μm. There was thus completed a ceramic cylinder without forming a thermal sprayed coating by plasma spraying.

EXAMPLE 11

The ceramic cylinders of Examples 9 and 10 and Comparative Example 3 were used in a CVD film-deposition device and a pre-cleaning device. In comparison under the same conditions, the ceramic cylinders of Examples 9 and 10 could be used continuously for a period of time of two-fold or more as compared with the ceramic cylinder not formed with a thermal sprayed coating of Comparative Example 3.

EXAMPLE 12

A doughnut-shaped ceramic ring (made of 99.9% alumina) was subjected to blast processing at a pressure of 0.5 MPa using silicon carbide grit C#24 so as to have a surface roughness Ra of 9 μm. Next, on the ceramic ring was formed an alumina thermal sprayed coating by plasma spraying using a 99.9% alumina powder having a mean particle size of 35 μm. The thermal sprayed coating had a film thickness of from 0.1 to 0.2 mm and a surface roughness Ra of 10 μm. An X-ray analysis revealed that the crystal was substantially constituted of γ-alumina. Four ceramic rings were prepared, and three of them were charged in an electric furnace after the plasma spraying and kept at 900° C., 1,100° C. and 1,300° C., respectively for 2 hours. After the temperature thoroughly decreased, the three ceramic rings were taken out and rinsed in a clean room. There were thus completed four ceramic rings.

After the completion, the ceramic rings were used for film deposition by sputtering and pre-cleaning. As a result, these ceramic rings could be used continuously for a period of time of two-fold or more as compared with the ceramic cylinder not formed with a thermal sprayed coating of Comparative Example 3.

Next, after the use, each of the ceramic rings was cut into a half, and the half was dipped in nitric-hydrofluoric acid (a mixed aqueous solution of 30% nitric acid and 24% hydrofluoric acid) for 20 minutes, thereby removing entirely the adhered film of pre-cleaning. The resulting ceramic ring was dipped in nitric-hydrofluoric acid for an additional 5 hours. After dipping, the resulting ceramic ring was compared with the ceramic ring not dipped in nitric-hydrofluoric acid in terms of adherence by measuring a peeling strength of the thermal sprayed coating. The peeling strength was evaluated in terms of a maximum strength at which the ceramic and the thermal sprayed coating, each of which was adhered to a tool with an adhesive, were drawn in an opposite direction and separated from each other.

With respect to the adhesion of the sample not dipped in nitric-hydrofluoric acid, the peeling strength was 4 MPa for the sample not heat-treated, 6 MPa for the sample heat-treated at 900° C., 10 MPa for the sample heat-treated at 1,100° C., and 15 MPa for the sample heat-treated at 1,300° C., respectively. Further, with respect to the adhesion of the sample dipped in nitric-hydrofluoric acid, the peeling strength was 0.5 MPa for the sample not heat-treated, 2 MPa for the sample heat-treated at 900° C., 8 MPa for the sample heat-treated at 1,100° C., and 13 MPa for the sample heat-treated at 1,300° C., respectively. Thus, it was understood that the adhesion became two times or more by the heat treatment at 1,000° C. or higher and that the thermal sprayed coating after the treatment with nitric-hydrofluoric acid was low in reduction of the adhesion. Further, the crystal form of the thermal sprayed coating was examined by X-ray diffraction. As a result, the samples heated-treated at 1,100° C. or higher were substantially constituted of α-alumina, in which γ-alumina was not observed.

EXAMPLE 13

Next, a doughnut-shaped ceramic ring having a thermal sprayed coating made of a magnesia-alumina spinel was prepared. A ceramic ring (made of 99.9% alumina) was subjected to blast processing at a pressure of 0.5 MPa using silicon carbide grit C#24 so as to have a surface roughness Ra of 9 μm. Next, on the ceramic ring was formed a spinel thermal sprayed coating by plasma spraying using granules having a mean particle size of 45 μm, which were prepared by mixing 99.9% alumina and 99.9% magnesia in a ratio of 1/1. The thermal sprayed coating had a film thickness of from 0.1 to 0.2 mm and a surface roughness Ra of 12 μm. An X-ray analysis revealed that the crystal form was a spinel structure. Four ceramic rings were prepared, and three of them were charged in an electric furnace after the thermal spraying and kept at 900° C., 1,100° C. and 1,300° C., respectively for 2 hours. After the temperature thoroughly decreased, the three ceramic rings were taken out and rinsed in a clean room. There were thus completed four ceramic rings.

The ceramic rings were used for pre-cleaning. As a result, these ceramic rings could be used continuously for a period of time of two-fold or more as compared with the ceramic cylinder not formed with a thermal sprayed coating of Comparative Example 3.

Next, after the use, each of the ceramic rings was cut into a half, and the half was dipped in nitric-hydrofluoric acid (a mixed aqueous solution of 30% nitric acid and 24% hydrofluoric acid) for 20 minutes, thereby removing entirely the adhered film of pre-cleaning. The resulting ceramic ring was dipped in nitric-hydrofluoric acid for an additional 5 hours. After dipping, samples were cut out from the resulting ceramic rings together with the ceramic ring not dipped in nitric-hydrofluoric acid and examined with respect to the adhesion of the thermal sprayed coating.

With respect to the adhesion of the sample not dipped in nitric-hydrofluoric acid, the peeling strength was 5 MPa for the sample not heat-treated, 7 MPa for the sample heat-treated at 900° C., 12 MPa for the sample heat-treated at 1,100° C., and 18 MPa for the sample heat-treated at 1,300° C., respectively. Further, with respect to the adhesion of the sample dipped in nitric-hydrofluoric acid, the peeling strength was 1 MPa for the sample not heat-treated, 2 MPa for the sample heat-treated at 900° C., 9 MPa for the sample heat-treated at 1,100° C., and 15 MPa for the sample heat-treated at 1,300° C., respectively. Thus, it was understood that the adhesion became two times or more by the heat treatment at 1,000° C. or higher and that the thermal sprayed coating after the treatment with nitric-hydrofluoric acid was low in reduction of the adhesion.

The quartz glass parts and the ceramic parts according to the present invention have the following advantages.

(1) As compared with the conventional quartz glass parts and ceramic parts, the quartz glass parts and the ceramic parts according to the present invention are superior in adherence of a film-like adherend. Accordingly, when used in film-deposition devices and pre-cleaning devices, they are low in contamination of the products by dust generation and can be continuously used over a long period of time.

(2) Ones in which a substrate has a groove shape having an anchor effect for adhesion to a ceramic thermal sprayed coating are superior in adhesion between the substrate and the ceramic thermal sprayed coating, are free from peeling off of the ceramic thermal sprayed coating itself, and are superior in durability.

(3) The parts having a surface roughness Ra of from 1 to 5 μm according to the present invention are superior in plasma resistance as compared with the conventional parts. Accordingly, they are less in dust generation by corrosion of the parts by plasma and in degradation of the parts, are free from contamination of the products, and can be continuously used over a long period of time.

It should further be apparent to those skilled in the art that various changes in form and detail of the invention as shown and described above may be made. It is intended that such changes be included within the spirit and scope of the claims appended hereto.

This application is based on Japanese Patent Application No. 2001-347239 filed Nov. 13, 2001 and Japanese Patent Application No. 2001-347240 filed Nov. 13, 2001, the disclosures of which are incorporated herein by reference in their entireties.

What is claimed is:

1. A quartz glass part comprising a quartz glass and a ceramic thermal sprayed coating formed on the surface of the quartz glass, wherein the ceramic thermal sprayed coating is made of alumina, partially stabilized zirconia, or magnesia-alumina spinel, which is a spherical powder having a relative density of 80% or more, the ceramic thermal sprayed coating having a surface roughness Ra of from 5 to 20 μm and a relative density of from 70 to 97%.

2. A quartz glass part comprising a quartz glass and a ceramic thermal sprayed coating formed on the surface of the quartz glass, the quartz glass having a surface roughness Ra of from 5 to 15 μm and an average length of micro-cracks of from 1 to 100 μm, with an average angle of the micro-cracks to the quartz glass surface being from 10 to 70°, and the ceramic thermal sprayed coating having a surface roughness Ra of from 5 to 20 μm and a relative density of from 70 to 97%.

3. The quartz glass part according to claim 2, wherein the ceramic thermal sprayed coating is made of alumina, partially stabilized zirconia, or a magnesia-alumina spinel.

4. A quartz glass part comprising a quartz glass and a ceramic thermal sprayed coating formed on the surface of the quartz glass, the quartz glass having from 10 to 200 per millimeter of grooves having a width of from 5 to 50 µm, and the ceramic thermal sprayed coating having a surface roughness Ra of from 1 to 20 µm.

5. A quartz glass part comprising a quartz glass and a ceramic thermal sprayed coating formed on the surface of the quartz glass, the quartz glass having from 10 to 200 per millimeter of grooves having a width of from 5 to 50 µm and a length of from 10 to 200 µm, and the ceramic thermal sprayed coating having a surface roughness Ra of from 1 to 20 µm.

6. The quartz glass part according to claim 4, wherein the ceramic thermal sprayed coating is made of alumina, partially stabilized zirconia, or a magnesia-alumina spinel.

7. The quartz glass part according to claim 5, wherein the ceramic thermal sprayed coating is made of alumina, partially stabilized zirconia, or a magnesia-alumina spinel.

8. A ceramic part comprising a ceramic substrate having a ceramic thermal sprayed coating formed thereon, the ceramic thermal sprayed coating having a surface roughness Ra of from 5 to 20 µm and having a peel strength of 8 Mpa or more to the substrate after heat treatment at from 1,000 to 1,600° C.

9. The ceramic part according to claim 8, wherein the ceramic thermal sprayed coating is made of α-alumina, partially stabilized zirconia, or a magnesia-alumina spinel.

10. A process of producing the quartz glass part according to any one of claims 1, 2 or 4, which comprises forming a ceramic thermal sprayed coating on a quartz glass by plasma spraying using a raw material powder having a mean particle size of from 30 to 60 µm.

11. The process of producing the quartz glass part according to claim 10, wherein the ceramic thermal sprayed coating is formed by plasma spraying at a distance between a spray gun and a substrate in the range of from 140 to 180 mm and using plasma gas at least having from 10 to 50% of hydrogen added thereto.

12. The process of producing the quartz glass part according to claim 10, wherein after subjecting the quartz glass to blast processing with spherical grit, the ceramic thermal sprayed coating is formed by plasma spraying at a distance between a spray gun and a substrate in the range of from 140 to 180 mm and using plasma gas at least having from 10 to 50% of hydrogen added thereto.

13. The process of producing the quartz glass part according to any one of claims 4 to 7, which comprises subjecting the surface of a quartz glass to blast processing, etching the quartz glass surface with an acid containing at least hydrofluoric acid to form the from 10 to 200 per millimeter of grooves, and then forming a ceramic thermal sprayed coating on the etched quartz glass surface.

14. The process of producing the quartz glass part according to claim 13, wherein the blast processing is carried out using spherical grit, and the ceramic thermal sprayed coating is formed by plasma spraying at a distance between a spray gun and a substrate in the range of from 140 to 180 mm and using plasma gas at least having from 10 to 50% of hydrogen added thereto.

15. A process of producing the ceramic part according to any one of claims 8 and 9, which comprises subjecting the surface of a ceramic substrate to blast processing and then forming a ceramic thermal sprayed coating on the blasted ceramic substrate surface by plasma spraying using a raw material powder having a mean particle size of from 30 to 60 µm.

16. The process of producing the ceramic part according to claim 15, wherein after subjecting the substrate of the ceramic substrate to blast processing, the blasted ceramic substrate surface is subjected to etching treatment with an acid containing at least hydrofluoric acid, and plasma spraying is carried out at a distance between a spray gun and the substrate in the range of from 140 to 180 mm and using plasma gas at least having from 10 to 50% of hydrogen added thereto.

17. The process of producing the ceramic part according to claim 15, wherein after subjecting the substrate of the ceramic substrate to blast processing, the ceramic thermal sprayed coating is formed by plasma spraying at a distance between a spray gun and the substrate in the range of from 140 to 180 mm and using plasma gas at least having from 10 to 50% of hydrogen added thereto, followed by heat treatment at from 1,000 to 1,600° C.

18. The process of producing the ceramic part according to claim 15, wherein after subjecting the substrate of the ceramic substrate to blast processing, the blasted ceramic substrate surface is subjected to etching treatment with an acid containing at least hydrofluoric acid, and the ceramic thermal sprayed coating is then formed by plasma spraying at a distance between a spray gun and the substrate in the range of from 140 to 180 mm and using plasma gas at least having from 10 to 50% of hydrogen added thereto, followed by heat treatment at from 1,000 to 1,600° C.

* * * * *